(12) United States Patent
Wang (10) Patent No.: US 7,470,565 B2
(45) Date of Patent: Dec. 30, 2008

(54) METHOD OF WAFER LEVEL PACKAGING AND CUTTING

(75) Inventor: Shun-Ta Wang, Taipei Hsien (TW)

(73) Assignee: Touch Micro-System Technology Inc., Yangmei Township, Taoyuan County (TW)

( * ) Notice: Subject to any disclaimer, the term of this patent is extended or adjusted under 35 U.S.C. 154(b) by 223 days.

(21) Appl. No.: 11/426,945

(22) Filed: Jun. 28, 2006

(65) Prior Publication Data

US 2007/0166883 A1    Jul. 19, 2007

(30) Foreign Application Priority Data

Jan. 18, 2006    (TW) .................................. 95101919

(51) Int. Cl.
*H01L 21/00*    (2006.01)

(52) U.S. Cl. ...................................... 438/113
(58) Field of Classification Search ................ 257/783, 257/680, 59; 438/113

See application file for complete search history.

(56) References Cited

U.S. PATENT DOCUMENTS

| 5,990,566 | A | * | 11/1999 | Farnworth et al. | .......... 257/783 |
| 6,476,415 | B1 | * | 11/2002 | Walker et al. | ................. 257/59 |
| 6,661,084 | B1 | * | 12/2003 | Peterson et al. | ............. 257/680 |
| 2003/0214007 | A1 | | 11/2003 | Tao | |
| 2006/0001114 | A1 | | 1/2006 | Chen | |

FOREIGN PATENT DOCUMENTS

TW    I236111    7/2005

* cited by examiner

*Primary Examiner*—Evan Pert
*Assistant Examiner*—Monica D Harrison
(74) *Attorney, Agent, or Firm*—Winston Hsu (57) ABSTRACT

A packaging wafer has a plurality of cavities and a plurality of trenches on a front surface thereof. The packaging wafer is bonded to the element wafer, and a first cutting method is performed. Afterward a piece of tape is provided and is attached to the packaging wafer. Moreover, a second cutting process is performed and then the piece of tape is removed. Therefore, a wafer level package is formed. In addition, the wafer level package is divided into a plurality of individual packages.

27 Claims, 10 Drawing Sheets

METHOD OF WAFER LEVEL PACKAGING AND CUTTING

BACKGROUND OF THE INVENTION

1. Field of the Invention

The invention relates to a method of packaging and cutting, and more particularly, to a method of wafer level packaging and cutting.

2. Description of the Prior Art

Packaging is an important step of semiconductor device fabrication. This process provides the core structure of the package to protect the fragile semiconductor device, such as optical device or micro-electromechanical systems (MEMS) device, from damage resulting from the environment. This damage may result from mechanical force or particle contamination. The package may also provide physical suspension and signal input/output.

The conventional packaging method is illustrated as follows. A well-constructed wafer is divided to form a plurality of dies. Then, a die bonding process is performed such that each die is bound on a lead frame with epoxy. Furthermore, a wire-bonding process or a flip-chip process is performed to finish the packaging process. Semiconductor packages fabricated by the conventional packaging method have a larger size, which runs counter to the trend of manufacturing tiny electronic products. In addition, the conventional packaging method is quite complicated in regards to batch production. Moreover, the cutting process is a critical process that is performed after the conventional packaging method. During cutting, mechanical force may destroy the structure of the package and particles may contaminate the product. These conditions may reduce the yield of production.

SUMMARY OF THE INVENTION

It is therefore a primary objective of the claimed invention to provide a method of wafer level packaging and cutting to increase the yield and reliability of the packaging process.

According to the claimed invention, a method of wafer level packaging and cutting is provided. A packaging wafer comprising a plurality of cavities on the front surface thereof is provided. A pre-cutting process is performed to form a plurality of trenches between the cavities and a plurality of partitions between the cavities and trenches. In addition, the packaging wafer has a thickness greater than a depth of trenches. An element wafer having a plurality of devices and a plurality of bonding pads on a surface thereof is provided. Then the packaging wafer is bonded to the packaging wafer. A cutting process is performed upon the packaging wafer along the position corresponding to the trenches. A piece of tape is provided and attached to the packaging wafer. Thereafter, the tape is removed with an unbound part of the packaging wafer to expose the bonding pads. A wafer level package is formed and is able to undergo wafer level testing.

The method of the invention may simplify the cutting process and diminish the damage and contamination resulting from the cutting process. The method may apply to electronic device packages, micro-electromechanical systems (MEMS) device packages, and optical device packages. In addition, the method of the invention reduces the yield loss caused by following processes, such as a cutting process, a breaking process, and a cleaning process. The method also has advantages of easy testing, high-yield, ease of batch production, and compatibility with general semiconductor processes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
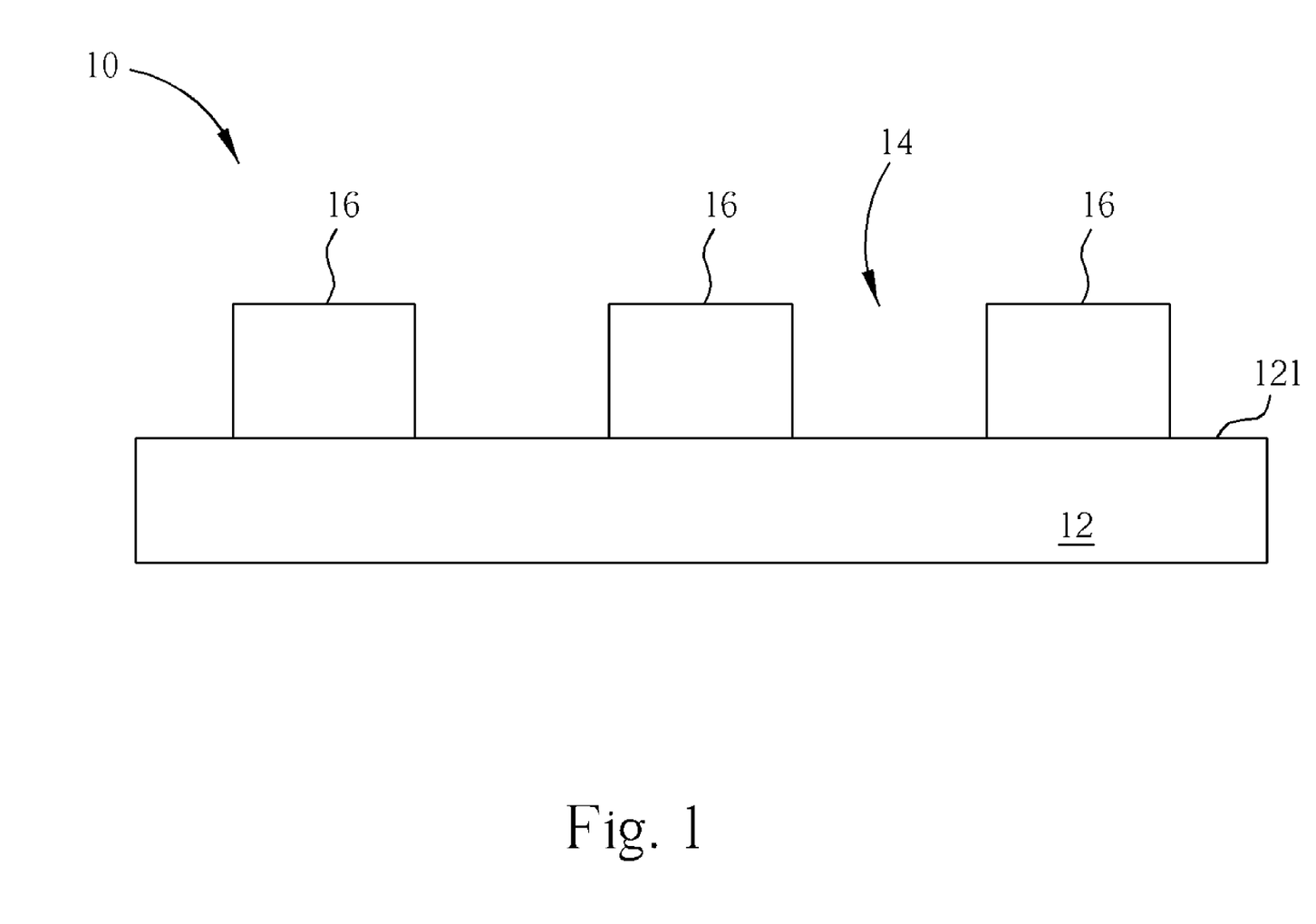
FIG. 1 through FIG. 9 are schematic diagrams illustrating a method of wafer level packaging and cutting according to a preferred embodiment of the invention.
Figure 2:
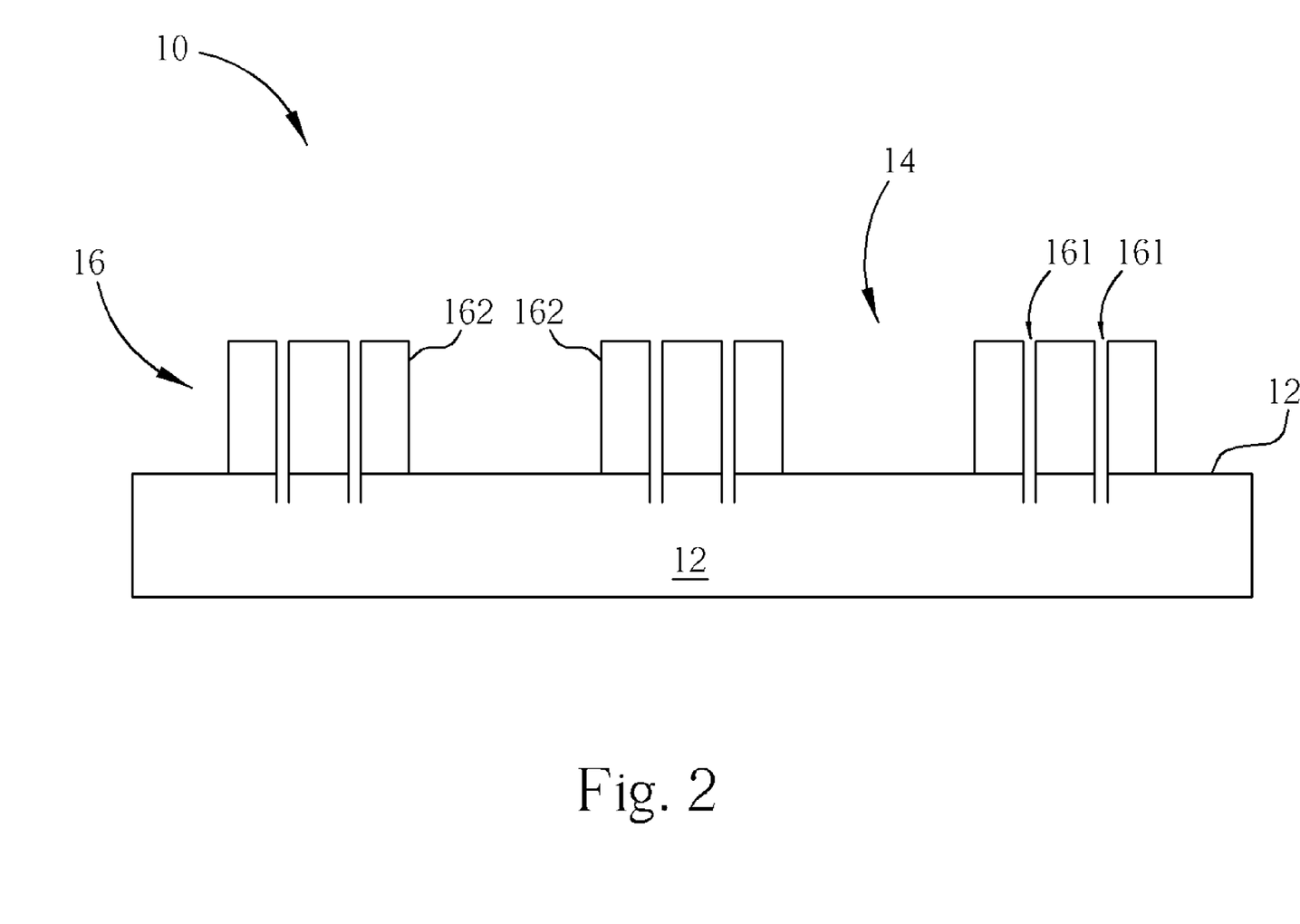

FIG. 1 through FIG. 9 are schematic diagrams illustrating a method of wafer level packaging and cutting according to a preferred embodiment of the invention. As shown in FIG. 1, a packaging wafer 10 is provided. The packaging wafer 10 comprises a transparent substrate 12, a pattern 16, and a plurality of cavities 14 defined by the pattern 16 on the front surface 121 of the transparent substrate 12. The transparent substrate 12 may comprise quartz, plastic, glass, or other light-transmissible materials. The transparent substrate 12 is a glass substrate in this embodiment. Please refer to FIG. 2. A pre-cutting process is performed upon predetermined positions of the packaging wafer 10. The pre-cutting process may be a wet wafer-cutting process, such as a wet etching process, or may be a dry wafer-cutting process, for instance, a dry etching process or cutting by blade. The pre-cutting process forms a plurality of trenches 161 on the pattern 16, and therefore defines a plurality of partitions 162 between the trenches 161 and the cavities 14. In addition, the trenches 161 penetrate the pattern 16 and reach the transparent substrate 12. However, the trenches 161 do not intersect the transparent substrate 12. In this embodiment, the trenches 161 have a track about 100 micrometer (μm) in depth on the transparent substrate 12. However, the depth of trenches is not limited and may be adjusted depending on the thickness of the transparent substrate 12.

Figure 3:
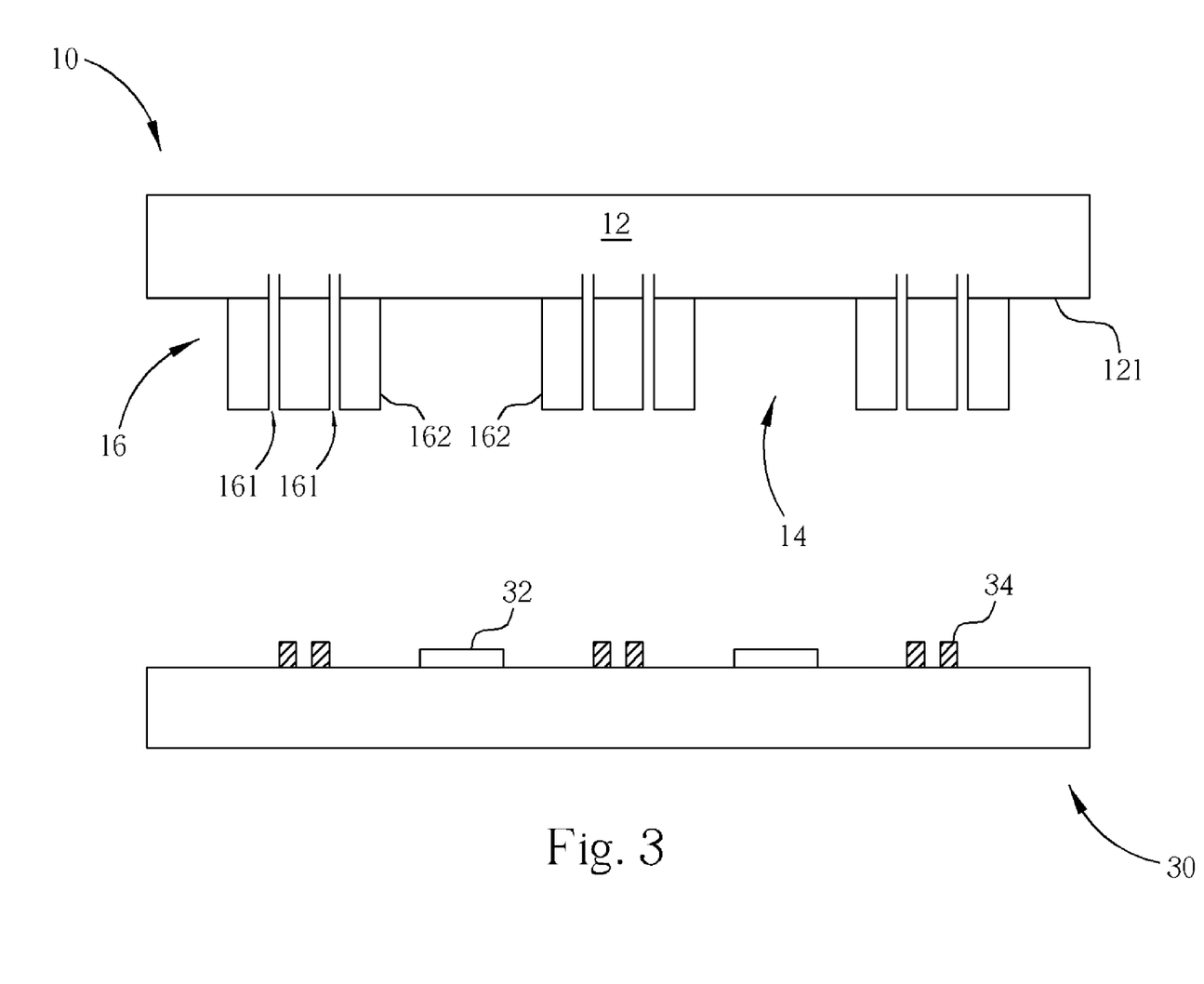

As shown in FIG. 3, an element wafer 30 is provided. The element wafer 30 comprises a plurality of devices 32 and a plurality of bonding pads 34. The devices 32 may be optical devices, electrical devices, or MEMS devices. In this embodiment, the devices 32 are image sensor devices. Thereafter, the packaging wafer 10 is aligned with the element wafer 30 so that the cavities 14 of the packaging wafer 10 correspond to the devices 32 of the element wafer 30.

Figure 4:
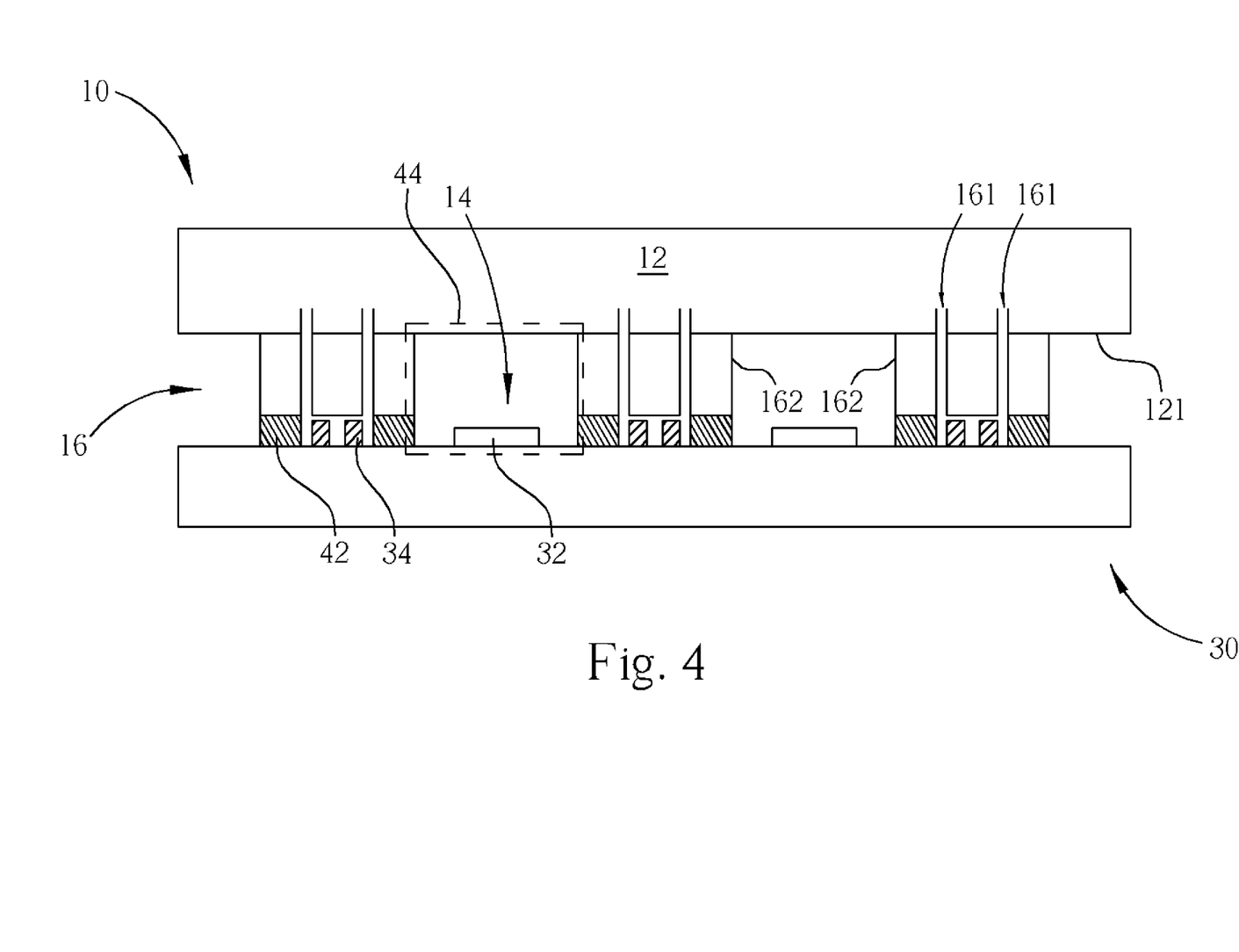

As shown in FIG. 4, a binder 42, such as polymer glue or glass frit, is formed on the end of the partition 162 by printing or smearing. The binder may also be formed at the positions on the element wafer 30 corresponding to the partitions 162. Accordingly, a hermetic bonding process is performed to bond the cavities 14 to the element wafer 30 and to form a plurality of hermetic windows 44. These hermetic windows 44 provide spaces for movement of the devices 32 and protection of the devices 32.

Figure 5:
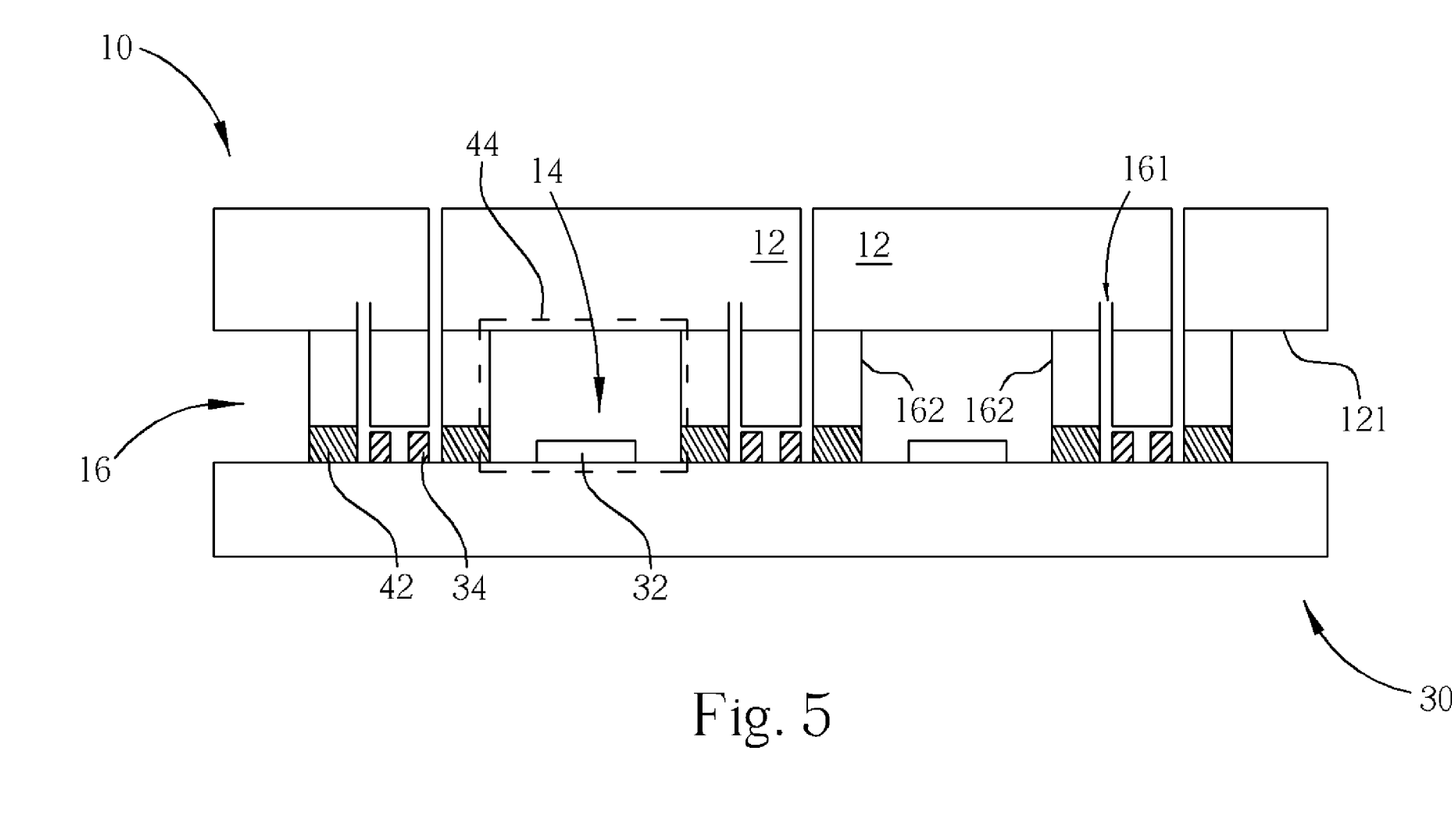

As shown in FIG. 5, a first cutting process is performed along the positions corresponding to a part of the trenches 161 upon the packaging wafer 10. Since the trenches 161 formed by the pre-cutting process have tracks upon the transparent substrate 12, the first cutting process may penetrate the packaging wafer 10 easily. The hermetic windows 44 protect the devices 32 from damage or particle contamination resulting from the first cutting process.

Figure 6:
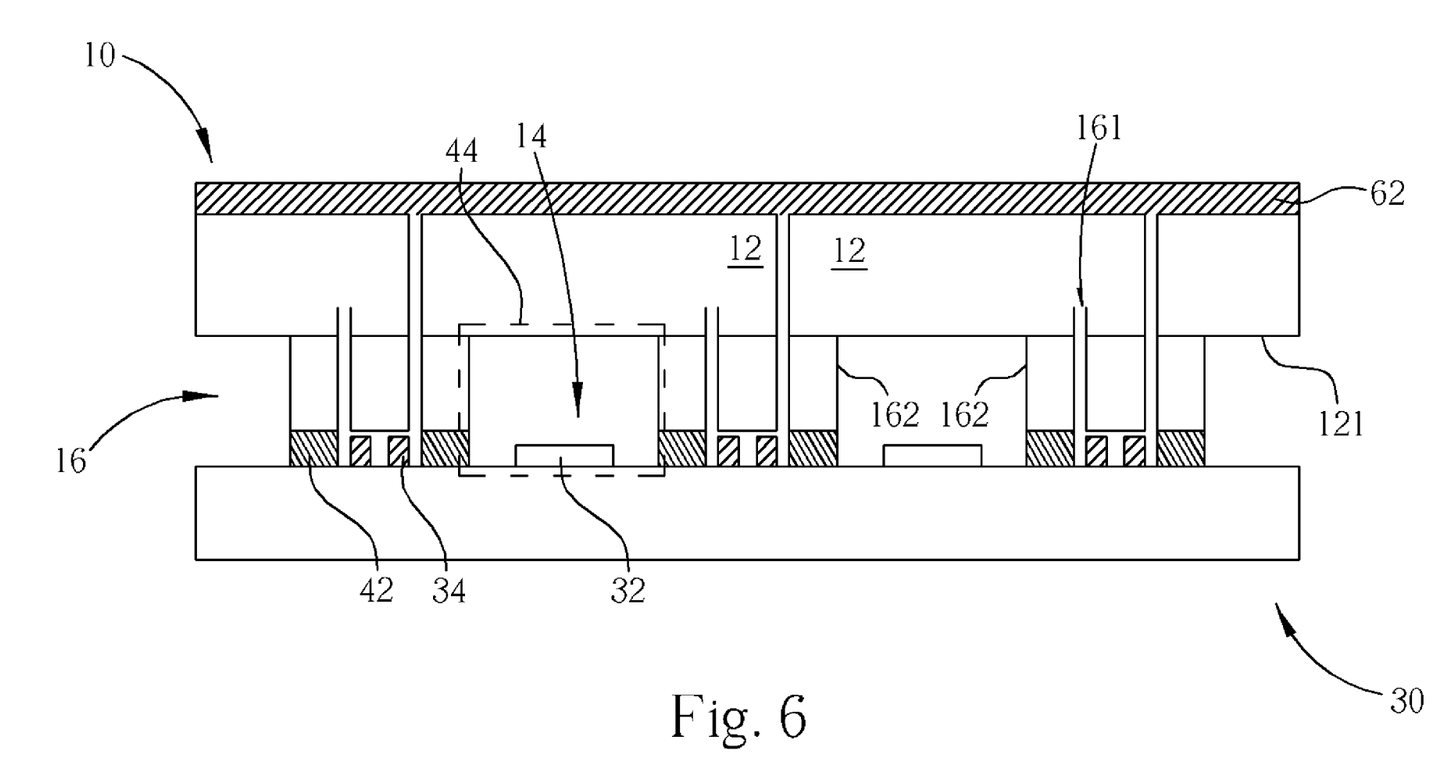
Figure 7:
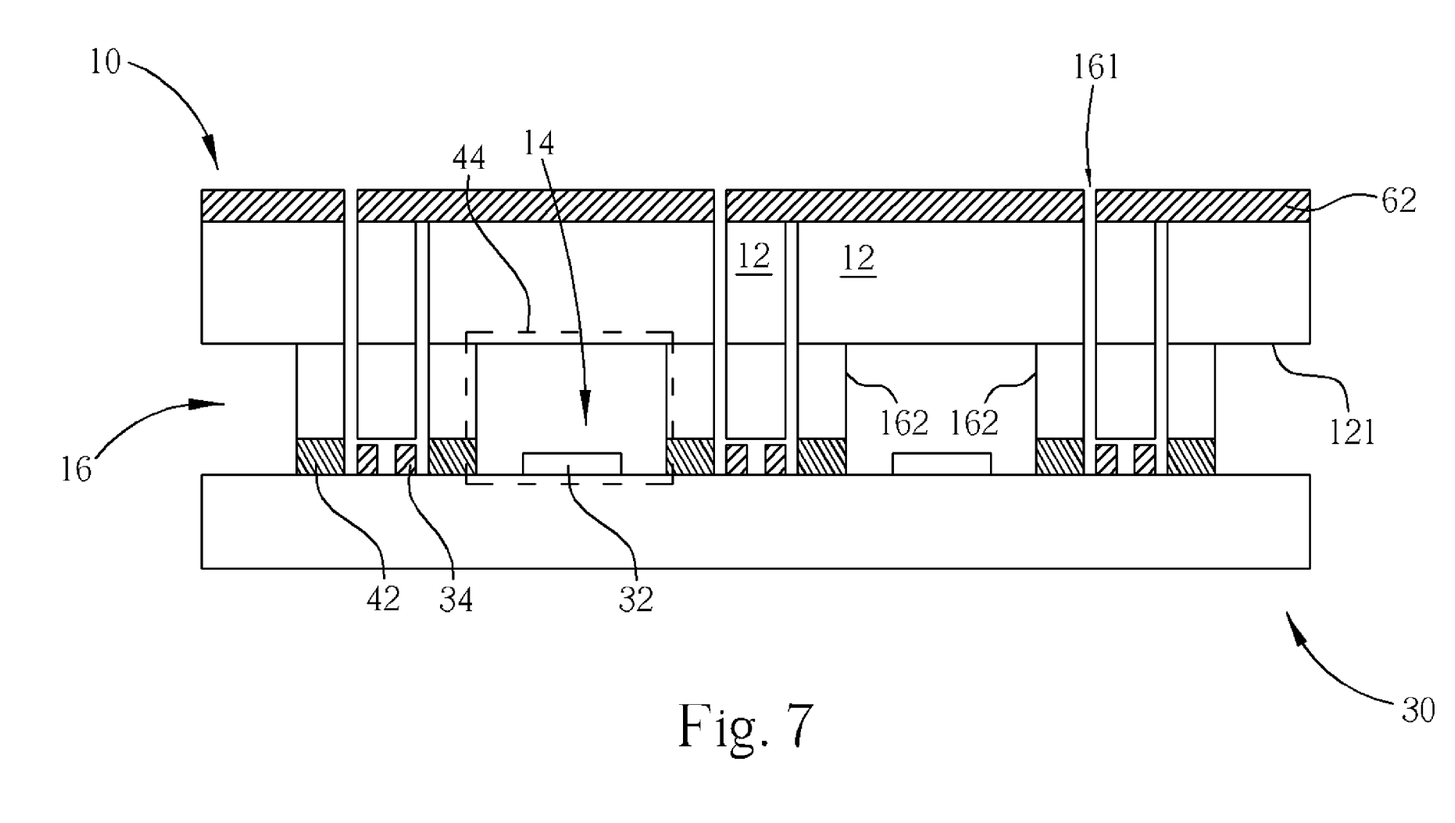

Please refer to FIG. 6. A piece of tape 62 is provided and attached to the packaging wafer 10. The tape 62 may be UV tape, thermal tape, or blue tape. As shown in FIG. 7, a second cutting process is performed along the other part of the trenches 161 upon the packaging wafer 10. The second cutting process penetrates the tape 62 and the transparent substrate 12 to separate an unbound part of the packaging wafer 10 from the hermetic windows 44.

Figure 8:
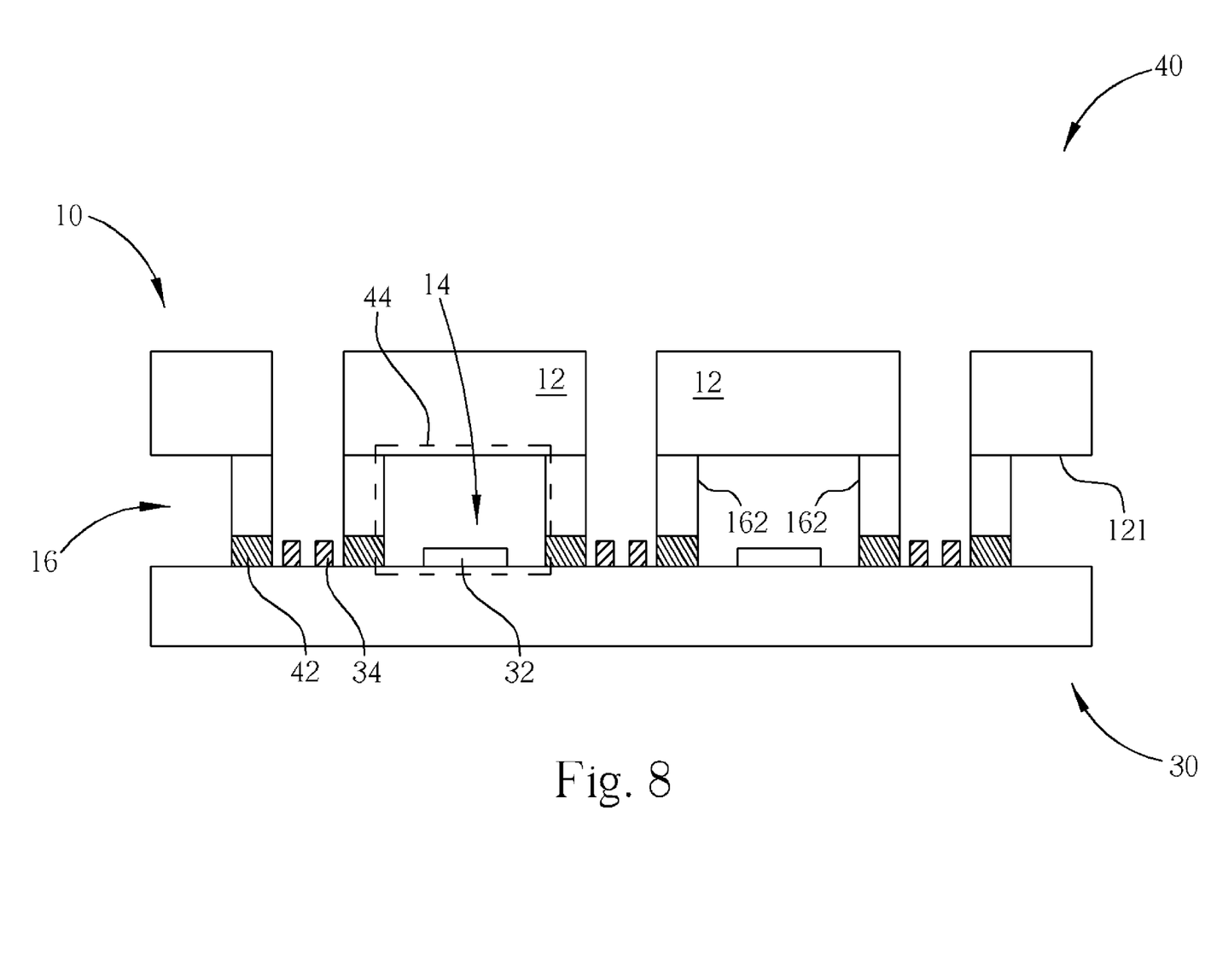

As shown in FIG. 8, the tape 62 is removed along with the unbound part of the packaging wafer 10 to expose the bonding pads 34. Therefore, a wafer level package 40 is formed. To sum up, the tape 62 is attached to the packaging wafer 10, and then the second cutting process is performed. Accordingly, the tape 62 is removed with the unbound part of the packaging wafer 10 to prevent the blade from breaking caused by vibration of the unbound part of the packaging wafer 10. This may also reduce the risk of the devices 32 being damaged by the packaging wafer 10 falling. In addition, the wafer level package 40 may undergo a wafer level testing to monitor the quality of the wafer level package 40.

Figure 9:
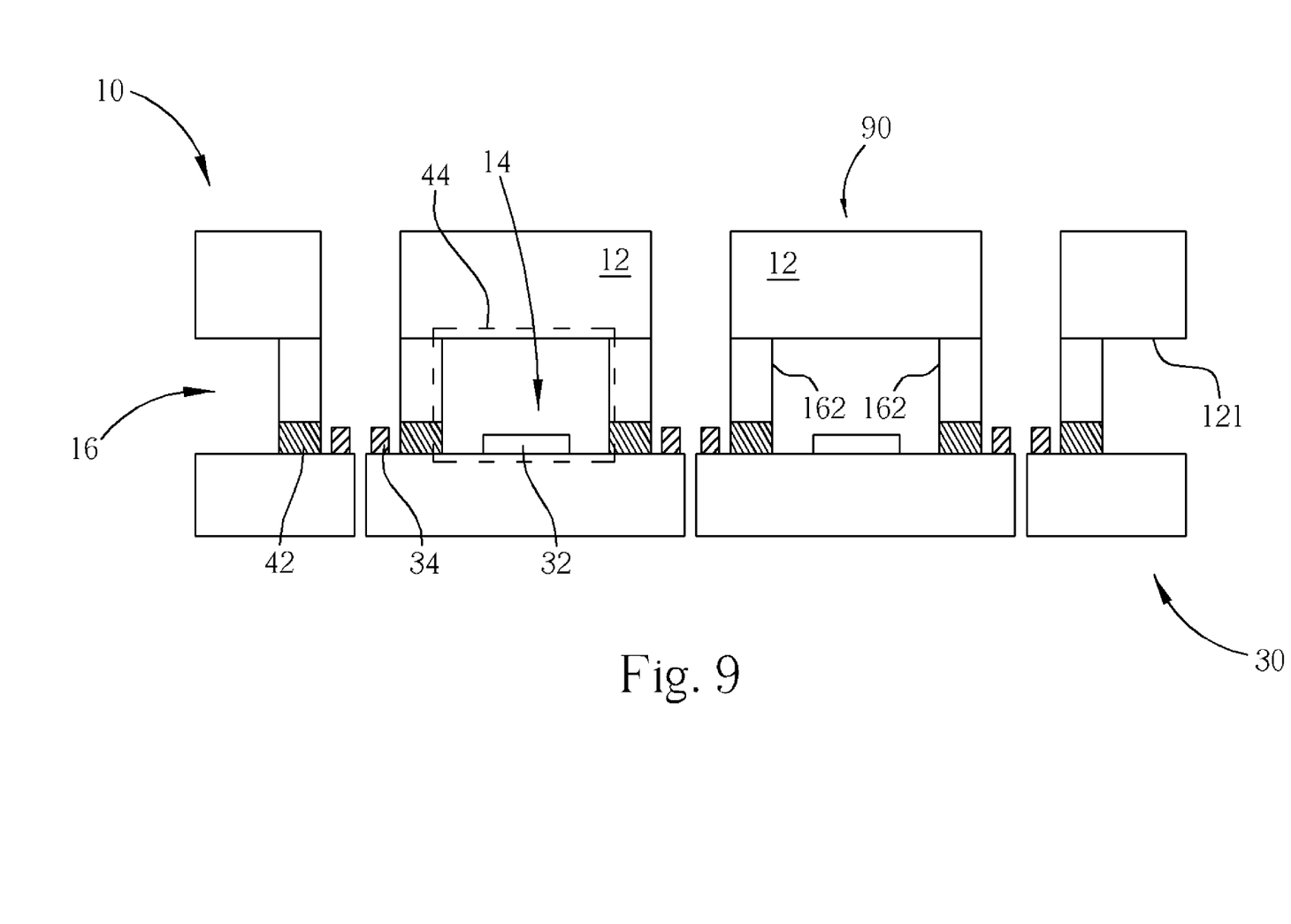

Please refer to FIG. 9. After performing the wafer level testing, the wafer level package 40 is divided into a plurality of individual packages 90 for following electronic product manufacture.

Figure 10:
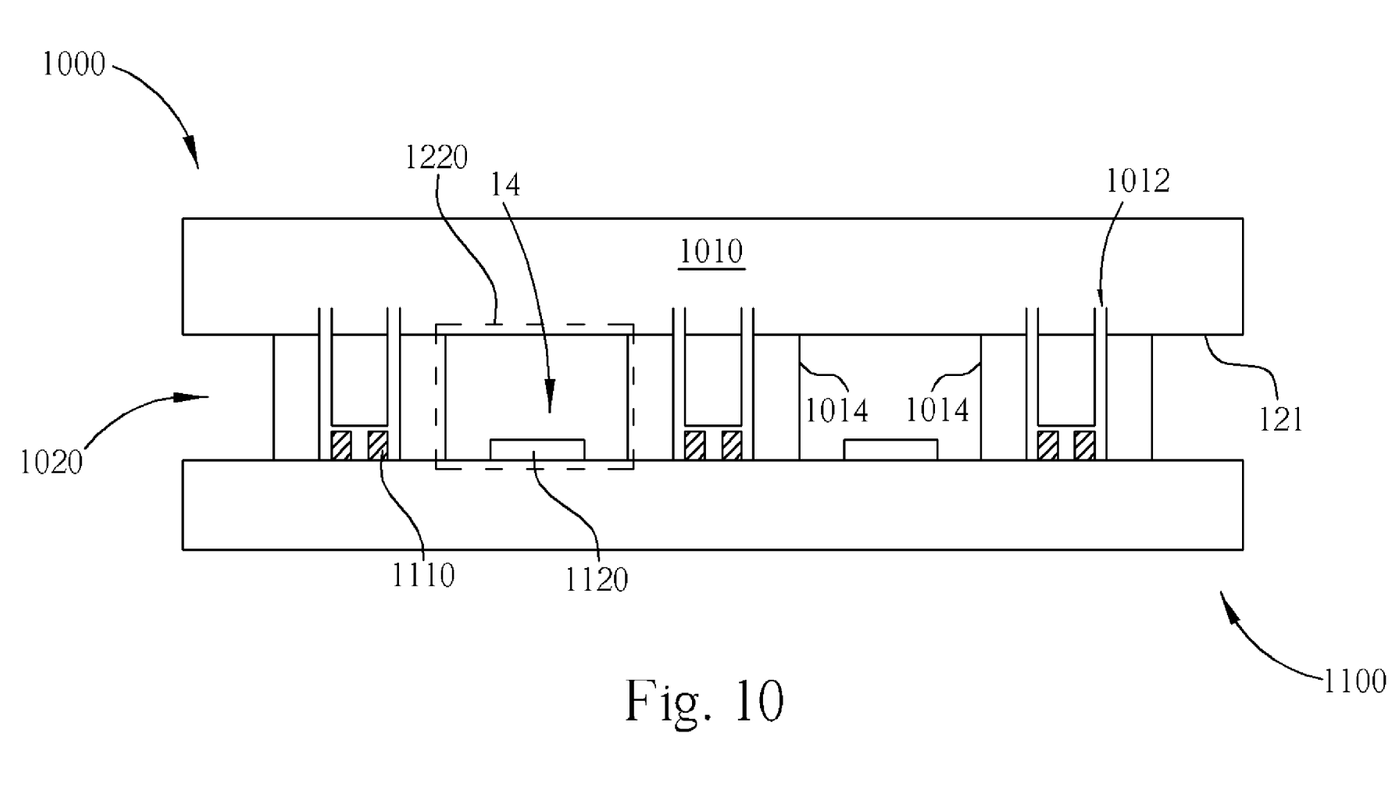
FIG. 10 illustrates another bonding method of the packaging wafer and the element wafer.

In addition to the above-mentioned bonding method, the packaging wafer and the element wafer may be bonded together by other methods. Please refer to FIG. 10. FIG. 10 illustrates another bonding method of the packaging wafer and the element wafer. As shown in FIG. 10, an element wafer 1100 and a packaging wafer 1000 are provided. The element wafer 1100 comprises a plurality of devices 1120 and a plurality of bonding pads 1100 on the surface thereof. The packaging wafer 1000 comprises a transparent substrate 1010, a pattern 1020, and a plurality of cavities (not shown) defined by the pattern 1020 on a front surface thereof, wherein each pattern 1020 has a notch in the center on the surface of the pattern 1020. A pre-cutting process is performed and a plurality of trenches 1012 is formed. The trenches 1012 and the pattern 1020 define a plurality of partitions 1014. Due to each pattern 1020 having a notch on its surface, the partition 1014 has a thickness greater than that of the center of the pattern 1020. The trenches 1012 penetrate the pattern 1020 and reach the transparent substrate 1010. However, the trenches 1012 do not intersect the transparent substrate 1010 and have tracks on the transparent substrate with a depth of about 100 µm. The depth of the tracks may change depending on the thickness of the packaging wafer 1010. Thereafter, the packaging wafer 1000 is aligned with the element wafer 1100 so that the cavities of the packaging wafer 1000 are corresponding to the devices 1120 of the element wafer 1100. A hermetic bonding process is performed to bond the packaging wafer 1000 and the element wafer 1100. Due to the thickness of the partition 1014 being greater than that of the center of the pattern 1020, the bonding between the wafers may use a non-intermediate bonding method, such as anodic bonding or fusion bonding. Bonding of the cavities of the packaging wafer 1000 and the element wafer 1100 forms a plurality of hermetic windows 1220. After the formation of the hermetic windows 1220, the method of wafer level packaging and cutting may proceed to the steps illustrated by FIG. 5 through FIG. 9.

As described above, the method of the invention incorporates the performance of the pre-cutting process and the attachment of the tape into the packaging process of semiconductor devices. The pre-cutting process reduces damage and contamination caused by the following cutting process. While the cutting process is performed, the attachment of the tape may prevent breaking of the blade resulting from vibration of the unbound part of the packaging wafer. Consequently, the method of the invention improves the yield of the products. The method of the invention is able to be performed in batch production and is compatible to general semiconductor process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of wafer level packaging and cutting, comprising:
    providing a packaging wafer, the packaging wafer comprising a plurality of cavities on a front surface thereof;
    performing a pre-cutting process upon the front surface and forming a plurality of trenches between the cavities and a plurality of partitions between the trenches and the cavities, wherein the packaging wafer has a thickness greater than a depth of the trenches;
    providing an element wafer, the element wafer having a plurality of devices and a plurality of bonding pads on a surface of the element wafer;
    bonding the packaging wafer and the element wafer; and
    performing a cutting process along the trenches upon the packaging wafer, thereafter using a piece of tape to remove an unbound part of the packaging wafer to expose the bonding pads of the element wafer, and accordingly forming a wafer level package.

2. The method of claim 1, wherein the packaging wafer comprises a transparent substrate and a pattern, which defines the cavities, disposed on a front surface of the transparent substrate.

3. The method of claim 2, wherein the transparent substrate comprises glass, quartz, or plastic.

4. The method of claim 1, wherein bonding the packaging wafer and the element wafer forms a hermetical window from each cavity.

5. The method of claim 1, wherein the pre-cutting process is a wet wafer-cutting process.

6. The method of claim 1, wherein the pre-cutting process is a dry wafer-cutting process.

7. The method of claim 1, wherein the devices are optical devices.

8. The method of claim 1, wherein the devices are micro electro-mechanical systems (MEMS) devices.

9. The method of claim 1, wherein the partitions of the packaging wafer are bonded to the element wafer by a binder.

10. The method of claim 9, wherein the binder comprises a glass frit or a polymer glue.

11. The method of claim 1, wherein the partitions of the packaging wafer are bonded to the element wafer by anodic bonding or fusion bonding.

12. The method of claim 1, wherein performing the cutting process comprises:
    performing a first cutting process along a part of the trenches upon the packaging wafer;
    attaching the piece of tape to the packaging wafer;
    performing a second cutting process along the other part of the trenches upon the packaging wafer;
    removing the piece of tape along with the unbound part of the packaging wafer.

13. The method of claim 1, wherein the piece of tape is UV tape, thermal tape, or blue tape.

14. The method of claim 1, further comprising performing a wafer level testing after the bonding pads of the element wafer are exposed.

15. The method of claim 14 wherein the wafer level package is divided into a plurality of individual packages after the wafer level testing.

16. A method of wafer level packaging and cutting, comprising:
   providing a packaging wafer, the packaging wafer comprising a transparent substrate, a pattern disposed on a front surface of the transparent substrate, and a plurality of cavities, which are defined by the pattern, disposed on the front surface of the transparent substrate;
   performing a pre-cutting process upon the front surface of the packaging wafer, and forming a plurality of trenches between the cavities and a plurality of partitions between the trenches and the cavities, wherein the packaging wafer has a thickness greater than a depth of the trenches;
   providing an element wafer, the element wafer comprising a plurality of devices and a plurality of bonding pads on a surface of the element wafer;
   performing a hermetical bonding process to bond the packaging wafer and the element wafer to form a plurality of hermetic windows;
   performing a first cutting process along a part of the trenches upon the packaging wafer;
   providing a piece of tape and attaching the piece of tape to the packaging wafer;
   performing a second cutting process along the other part of the trenches upon the wafer;
   removing the piece of tape along with an unbound part of the packaging wafer to expose the bonding pads, and accordingly forming a wafer level package; and
   dividing the wafer level package to form a plurality of individual packages.

17. The method of claim 16, wherein the transparent substrate comprises glass, quartz or plastic.

18. The method of claim 16, wherein the pre-cutting process is a wet wafer-cutting process.

19. The method of claim 16, wherein the pre-cutting process is a dry wafer-cutting process.

20. The method of claim 16, wherein the devices of the element wafer are optical devices.

21. The method of claim 16, wherein the devices of the element wafer are micro electro-mechanical systems (MEMS) devices.

22. The method of claim 16, wherein the partitions of the packaging wafer are bonded to the element wafer by a binder.

23. The method of claim 22, wherein the binder comprises a glass frit or a polymer glue.

24. The method of claim 16, wherein the partitions have a thickness greater than that of the pattern.

25. The method of claim 24, wherein the partitions of the packaging wafer are bonded to the element wafer by anodic bonding or fusion bonding.

26. The method of claim 16, wherein the piece of tape comprises UV tape, thermal tape, or blue tape.

27. The method of claim 16, further comprising performing a wafer level testing after the bonding pads of the packaging wafer are exposed.

* * * * *